United States Patent [19]

Tiemann et al.

[11] 3,772,102

[45] Nov. 13, 1973

[54] METHOD OF TRANSFERRING A DESIRED PATTERN IN SILICON TO A SUBSTRATE LAYER

[75] Inventors: Jerome J. Tiemann, Schenectady; William E. Engeler, Scotia; Dale M. Brown, Schenectady, all of N.Y.

[73] Assignee: General Electric Company, Schenectady, N.Y.

[22] Filed: Oct. 27, 1969

[21] Appl. No.: 871,730

Related U.S. Application Data

[63] Continuation of Ser. No. 606,242, Dec. 30, 1966, abandoned.

[52] U.S. Cl. .................... 156/13, 156/17, 148/189, 96/36.2

[51] Int. Cl. .................... H01l 7/00, H01l 7/50

[58] Field of Search ................ 156/17, 13; 96/36.2; 148/187

[56] References Cited

UNITED STATES PATENTS

| | | | |
|---|---|---|---|
| 3,544,399 | 12/1970 | Dill | 148/187 |
| 3,475,234 | 10/1969 | Kerwin et al. | 148/187 |
| 3,406,043 | 10/1968 | Balde | 117/212 |
| 3,193,418 | 7/1965 | Cooper et al. | 148/189 |
| 3,385,729 | 5/1968 | Larchian | 117/200 |
| 3,144,366 | 8/1964 | Rideout et al. | 148/179 |
| 3,135,638 | 6/1964 | Cheney et al. | 156/11 |

OTHER PUBLICATIONS

I.B.M. Technical Disclosure Bulletin Hallen et al. Vol. 6, No. 8, 1964, pp. 6 and 7.

*Primary Examiner*—J. Steinberg
*Attorney*—Richard R. Brainard, Paul A. Frank, Edward D. Murphy, Frank L. Neuhauser, Melvin M. Goldenberg and Oscar B. Waddell

[57] ABSTRACT

Methods for producing a desired pattern of retained and removed portions in a substrate layer of a material selected from the group consisting of silicon nitride, an oxide of silicon, and an oxynitride of silicon are disclosed. One method includes providing a transfer layer of silicon over the substrate layer, producing a pattern of removed and retained regions in the transfer layer and then etching the portions of the substrate layer exposed by the removed portions in the transfer layer with an etchant which etches the substrate layer without substantially etching the transfer layer to produce a pattern in the substrate layer substantially corresponding to that in the transfer layer. Other materials useful for transfer layers such as molybdenum, tungsten, nickel, chromium, and magnesium are also disclosed. Typical etchants for the various materials are also disclosed.

5 Claims, 1 Drawing Figure

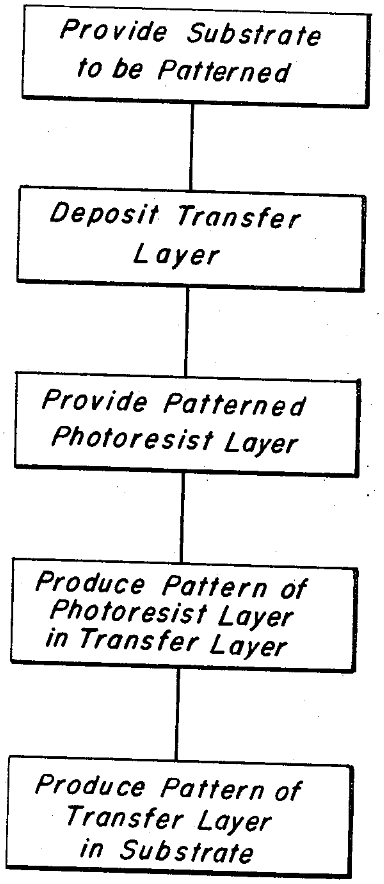
Inventors:
Jerome J. Tiemann;
William E. Engeler;
Dale M. Brown,
by Edward D. Murphy
Their Attorney.

METHOD OF TRANSFERRING A DESIRED PATTERN IN SILICON TO A SUBSTRATE LAYER

This application is a continuation of our application Ser. No. 606,242, filed Dec. 30, 1966, now abandoned.

This invention relates to the method of semiconductor device and integrated circuit manufacture wherein regions of varying electrical function are produced in or on a semiconductor body at locations defined by a masking process.

For a number of years the semiconductor industry has been dominated by a single material, Si, and by its oxide, $SiO_2$. The diffusion masking and passivating properties of thermally grown $SiO_2$ and the ability to produce an etched design pattern in this oxide by photo-engraving using photoresist techniques has been central to the semiconductor process technology. Recently, however, a new material, silicon nitride ($Si_3N_4$) has been introduced which not only performs many of the functions previously reserved exclusively for the oxide, but may also be useful for other tasks as well. It is, for example, a more effective diffusion mask since it is less permeable than $SiO_2$ to standard semiconductor dopants. In addition, it is more impervious to alkali metals than $SiO_2$. Because alkali ion drift in $SiO_2$ is one of the main causes of semiconductor device instability, silicon nitride passivation should, therefore, improve device stability. Since $Si_3N_4$ has a higher degree of chemical stability than $SiO_2$ and is not as easily penetrated by water and other atmospheric gases, it should generally have better passivation properties. These superior passivation properties could eliminate the need for sealed metal encapsulation.

A problem exists, however, in that $Si_3N_4$ has a very low reactivity to known solvents, being only very slowly dissolved even by concentrated HF(i.e.,48 percent solution). Several minutes are required to remove a few hundred Angstroms. Chemical etching of this type lifts the photo-resist masking films in current use from the nitride before the unmasked nitride regions can be removed by the etch. Photoengraved nitride patterns are thus difficult to form.

This adherence problem was also originally observed in $SiO_2$ processing but was solved for thin $SiO_2$ layers by using a less reactive etch. This etch, commonly referred to as "buffered HF" and comprising 10 parts $NH_4F$ (40 percent) to one part concentrated HF, increases the durability of the photoresist sufficiently to enable the etch to dissolve a thin $SiO_2$ layer before the resolution of the mask pattern is destroyed. For thick layers (approximately 1 micron or more) of $SiO_2$, however, a single layer of photoresist in buffered HF is marginal. In this instance, the use of multiple layers of photo-resist materials are workable. Even these solutions are not completely satisfactory for some $SiO_2$ layers and they are not practical for $Si_3N_4$ since its dissolution rates in HF and buffered HF are so much lower than the photoresist lifetimes on $Si_3N_4$ in these acid solutions. Because of these problems, as well as similar problems in other potential masking layers, an improved masking technique is desirable.

Accordingly, it is an object of this invention to provide a new and improved method of masking for use in semiconductor device processing.

A further object of this invention is the provision of a new and improved method of defining active and passive regions in semiconductive devices.

Another object of this invention is the provision of a new and improved method of producing patterns in the passivation layer of semiconductor devices.

It is also an object of this invention to provide a new and improved method of protecting selected portions of the passivation layer of semiconductor devices and integrated circuits during removal of other portions.

An additional object is the provision of a method of transferring a pattern to a substrate from a photoresist layer which is removed by the materials which etch the substrate.

Briefly, the novel method of this invention includes the steps of providing a body including a substrate layer in which a pattern of retained portions and removed portions is to be produced, for example for masking the body while regions of selected electrical function are formed in or on selected regions of the body; providing an overlying transfer layer which can be removed by a solution which does not remove the photoresist and which is not attacked by the material required to etch the substrate layer; masking the transfer layer with a suitable photoresist material, exposing the same to a desired pattern of light and removing portions defined by this pattern; etching the resultant surface in a suitable solution which removes the uncovered transfer layer without disturbing th photoresist material; and etching the body in a solution which attacks the substrate layer without removing the transfer layer. In a specific embodiment of this invention, we have discovered that several materials exhibit the properties required of the transfer film in the case where the substrate layer is an oxide or a nitride of silicon. Specifically, these materials, including, for example, molybdenum, tungsten, nickel and its copper alloys, and magnesium can be removed without removing those portions covered by a pattern of photoresist material and thereafter, the body can be etched in concentrated HF for a time sufficient to remove a substrate layer such as silicon nitride or a thick layer of silicon oxide according to the pattern defined by the exposure of the photoresist without affecting the portions of the substrate layer which are covered by the transfer layer.

The novel features believed characteristic of the invention are set forth in the appended claims. The invention itself, together with further objects and advantages thereof may best be understood by reference to the following description taken in connection with the appended drawing in which the sole figure is a flow chart representing the steps of this invention.

In general, the process of this invention includes the steps outlined in the flow chart. These will be described with particular regard to semiconductor device processing since this invention is of particular importance therein; however, it is noted that the basic concept may be more broadly applied.

A wafer of a material such as silicon in which a device or circuit is to be produced is first provided with a layer, hereinafter referred to as a substrate layer because it is so positioned with respect to the other layers used in this process, of the material of which portions are to be retained while others are removed. Usually, the substrate layer is to be used for masking during production of devices in or on the semiconductor and for later passivation. For ease of discussion, this layer is assumed to be silicon nitride although other materials could be used such as an oxide of silicon or an oxynitride of silicon such as is described and claimed in the copending application of Frederick K. Heumann, Ser. No. 598,305, assigned to the assignee of this invention and now abandoned. In the case of silicon oxide on silicon, the layer may be thermally grown; also, this or other materials may be deposited by other techniques such as pyrolytic decomposition or through a glow discharge. The substrate layer may be of any thickness sufficient to avoid cracks or pinholes and sufficient to withstand the subsequent preparation of elements of the semiconductive device or deposition of electrodes through openings therein, for example, by impurity diffusion or expitaxial deposition. In general, in the case of silicon nitride, this layer is on the order of a few hundred Angstrom Units to one micron.

In accord with this invention, a transfer layer, comprising a material which is compatible with the etching characteristics of the photoresist and of the substrate layer, is next deposited. For the specific case of nitrides or oxides of silicon, suitable materials include molybdenum, tungsten, magnesium, nickel and its copper alloys, silicon, germanium, selenium, tellurium, bismuth and antimony. Also, gold, silver, platinum, iridium and osmium may be used; however, these are difficult to etch without removing the photoresist and are therefore not preferred. The transfer layer may be deposited by sputtering or by evaporation, for example from an electron beam heated body of the material in a high vacuum system. In the case of silicon, it is preferred that a crystalline form be deposited by pyrolytic decomposition of silane or by halide transport. The thickness of the transfer layer is preferably about 1,000 Angstrom Units or more. In general, the edge definition of the hole later produced in the substrate layer is better for thinner transfer layers; however, good results have been obtained with metallic layers ranging in thickness of 700 Angstrom Units to 8,000 Angstrom Units. It is noted that even the thinnest films in this range were adequate to withstand the etching time in hydro-fluoric acid agent needed to dissolve a thick underlying masking layer of silicon nitride due to the relative insolubility of the transfer layer in this acid.

Next, a selected pattern is produced in the transfer layer through a photoresist material such as that manufactured and sold under the trademark KPR by the Eastman Kodak Company by techniques more fully described in the publication "Photosensitive Resists for Industry,"1962, published by the Eastman Kodak Co. To produce this pattern, a layer of photoresist material is spread over the transfer layer and the photoresist material is exposed to light through a mask and then cured by heating so that the regions at which it is desired to expose the semiconductor surface for device preparation can be removed by a solvent while the regions of photoresist where the masking is to be retained are untouched. After application of this solvent, the transfer layer is found to be covered by the photoresist material according to a desired pattern.

The wafer is next placed in an etching solution containing a material with attacks the transfer layer exposed by this pattern but does not either attack or lift the remaining photoresist material. For example, a ferricyanide etch including 92 grams of $K_3Fe(CN)_6$, 20 grams of KOH and 300 grams of water is suitable for use with molybdenum and tungsten while ferric chloride may be used for nickel. Other etches may also be used,depending on the transfer material. For example, the mixture known in the art as "dim etch" and including approximately 2 parts concentrated HF acid, 3 parts glacial acetic acid, 5 parts nitric acid and about 0.7 grams per liter of iodine may be used for silicon. These etches remove the material not protected by the photo-resist material, thus reproducing the pattern in the transfer layer. Next, the wafer is etched in a solution which attacks the substrate layer but does not attack the transfer layer. As previously noted, in the case of silicon nitride, concentrated hydrofluoric acid is the most convenient etchant; we have found that the materials mentioned above withstand this etchant and that these are suitable, in accord with this invention, for transferring the desired pattern from the photoresist material to the substrate layer. The silicon nitride etches in 48 percent HF at a rate of about 100A per minute or more, depending on the temperature of its formation. Thus even silicon nitride films ranging from 500 to 3,000 Angstrom Units can be removed in a short time. The resistance of the mentioned materials to this etch has been found to be so outstanding that very good resolution, or reproduction of the desired pattern, in the silicon nitride or other substrate layer can be achieved even when the wafer must be left in the etchant for long periods of time.

After the desired pattern has been produced in the substrate layer, the remaining photoresist material may be removed by wiping the wafer with trichloroethylene or other materials prepared for this purpose. If desired, the transfer layer may be left in place or it may be removed by etching with the ferricyanide etch previously described.

After the described steps have been completed, the wafer is ready for preparation of any of the various elements of a semiconductor device or circuit at the regions of the wafer surface exposed by removal of the masking layer. For example, the conventional impurity diffusion process to produce a region of conductivity different from that of the remainder of the body immediately under the surface of the wafer at the exposed region may be carried out or other processes such as epitaxial deposition of a desired material on the surface at the exposed region may be performed. Thereafter, the above described process may be repeated one or more times to form additional elements of the device or circuit at new locations or within the same region of the semiconductor surface, the placing of the elements being defined by the pattern produced in the photoresist material and repeated in the transfer and substrate layers.

In testing devices formed by the above process, we have found that the resolution of the original pattern as reproduced in the substrate layers, even in those which are extremely difficult to etch such as thick layers of silicon nitride, is extremely good and in fact is equivalent to the resolution achieved by the presently known film process utilizing an oxide layer on the order of 1 micron thick. In general, it is noted that this technique of utilizing a transfer layer to transfer desired patterns into a substrate can be used in various processes if the selected transfer material adheres to the substrate, if it is removable by using a photoresist pattern and if it withstands the etch needed for the substrate.

The materials used for the transfer layer in accord with this invention for semiconductor processing are set forth above. It is preferred to use molybdenum, tungsten, nickel or its copper alloys or magnesium since these are easily provided and very resistant to HF.

It is noted that, although magnesium dissolves in weak HF, in more concentrated HF (more than 5 percent) it forms a surface coating of MgF which prevents the removal of the remaining metal. In some situations, it may be preferred to use the listed non-metals since these may be less likely to introduce an impurity into the semiconductor.

The following examples are set forth to exemplify the practice of this invention. These examples include specific values of the parameters involved so that the invention may be practiced by those skilled in the art. It is noted however, that these examples are provided for purposes of illustration only and are not to be construed in a limiting sense.

EXAMPLE 1

A substrate layer of silicon nitride is deposited on the surface of a silicon wafer by the pyrolytic decomposition of silane and ammonia at 1,000°C. The layer is 1000 Angstrom Units thick. A transfer layer of molybdenum is then applied to the surface of the silicon nitride layer by heating a molybdenum sample with an electron beam to evaporate a portion thereof, the wafer and the sample being juxtaposed so that the molybdenum vapors deposit on the silicon nitride surface. The wafer is heated to a temperature of 400°C to improve the adherence of the molybdenum film to the silicon nitride. The molybdenum layer produced is 1,000 Angstrom Units thick. A layer of photoresist material is applied and a pattern of openings is produced therein by photolithographic methods. Next, the molybdenum film is etched in the ferricyanide etch previously identified for about 10 seconds. The pattern of the photoresist is then found to be transferred to the molybdenum. Finally, the wafer is etched in concentrated (48 percent) HF for 7 minutes. At the end of this time, the photoresist material left on the molybdenum is found to be essentially removed; however, the pattern of the original mask is reproduced in the nitride so that the desired regions of silicon are exposed. The resolution is determined from the straight line portions of the pattern to be better than 3000 Angstrom Units; that is, the straight lines contain no deviations greater than this amount. The silicon nitride covered by the molybdenum film is determined to be free from pinholes or other defects.

EXAMPLE 2

The process set forth in Example 1 is repeated except that the thickness of the silicon nitride is 3,000 Angstrom Units. The etch time in concentrated HF is 28 minutes. The pattern reproduction in the silicon nitride is found to be similar in quality to that stated in Example 1.

EXAMPLE 3

The process described in Example 1 was repeated except that the metallic layer is a 2,000 Angstrom Unit coating of silicon deposited pyrolytically from silane. The remaining steps are as described in Example 1 except that the etch used to produce the pattern in the silicon is referred to above as "dim etch."

EXAMPLE 4

A 1 micron layer of silicon dioxide is prepared on a silicon wafer by heating the wafer in a steam atmosphere to a temperature of 1,100°C for 2 hours. A 2,000 Angstrom Unit layer of molybdenum is sputtered on to the oxide layer, the wafer being heated to a temperature of 450°C. A photoresist pattern is produced as described in Example 1 and the pattern was reproduced in the molybdenum by etching in ferricyanide etch for 25 seconds. The device was etched in buffered HF for 10 minutes. The photoresist layer was then found to be severely cracked so that portions of the molybdenum film were exposed. The silicon dioxide under these portions was, however, protected by the molybdenum layer. The pattern of openings from the photoresist layer was reproduced in the silicon dioxide with good resolution and without defects in the portion retained.

EXAMPLE 5

The process set forth in Example 1 is repeated except that the transfer layer is a 1,000A thick coating of magnesium. The etchant used to reproduce the photo-resist pattern in the magnesium is dilute hydrofluoric acid. The results are similar to those described in Example 1.

EXAMPLE 6

The process set forth in Example 1 is repeated except that the transfer layer is a 3,000A thick coating of selenium deposited by evaporation. The etchant used to reproduce the photoresist pattern in the selenium is carbon disulfide at 40°C. The results are similar to those described in Example 1.

As previously noted, the concept of this invention is broadly applicable to other materials which can only be etched in solutions which would remove a photo-resist pattern. For example, substrates such as barium titanate or other ferrites used to produce single domain magnetic regions which are difficult to etch without damaging the photoresist may be covered with a transfer layer of a material such as silicon dioxide in which a desired pattern can easily be produced. This is then repeated in the substrate by an etchant such as boiling sulfuric acid which attacks the substrate without attacking the transfer layer.

As another example, thick gold leads used for interconnecting hybrid and integrated circuits may be patterned by applying a transfer layer of silicon dioxide which is easily etched in hydrofluoric acid buffered with nitric acid, thus permitting reproduction of a photoresist pattern therein. Next, aqua regia may be used to reproduce the pattern in the gold substrate, since this solution does not etch silicon dioxide.

Finally, it is noted that many materials which could not previously be patterned by photoresist techniques may be patterned by the method of this invention, thus opening the possibility of new applications for such materials. For example, the II–VI materials such as cadmium sulfide, may be covered by a transfer layer of chromium and patterned by etching in hot phosphoric acid which etches the cadmium sulfide but not the chromium.

In some situations, due to particular combinations of etching characteristics, it may be desirable to use multiple transfer layers to produce a pattern in a given material. As a particular example, it may be useful to provide silicon nitride as a transfer layer over another substrate because of the high degree of resistance of this nitride to many etchants. The nitride can be patterned as described above and the final etch would produce the pattern in the substrate.

It is noted that the discussion herein of transfer materials which "are not removed" in a solution which etches the substrate is intended to include both materials which are not attacked at all by the solution and those which are attacked at a rate sufficiently less than the rate of attack on the substrate so that the desired pattern can be reproduced.

While we have shown and described several embodiments of our invention, it will be apparent to those skilled in the art that many changes and modifications may be made without departing from our invention in its broader aspects; and we therefore intend the appended claims to cover all such changes and modifications as fall within the true spirit and scope of our invention.

What we claim as new and desire to secure by Letters Patent of the United States is:

1. The method of etching a layer of silicon nitride on a substrate comprising:

forming a film of silicon on said layer of silicon nitride which film of silicon may be selectively etched without affecting the silicon nitride, with the unetched portions of said film of silicon acting to resist etchants for the silicon nitride, selectively etching said film of silicon to thereby form a pattern of silicon on said layer of silicon nitride; and etching said silicon nitride in accordance with said etched pattern.

2. A method of producing a desired pattern of removed portions in a substrate layer comprising the steps of providing a substrate layer of a material selected from the group consisting of silicon nitride, an oxide of silicon, and an oxynitride of silicon providing a transfer layer of silicon over said substrate layer; producing a pattern of removed and retained regions in said transfer layer; and etching portions of said substrate layer exposed by the removed portions in said transfer layer with a solution of hydrofluoric acid to produce a pattern in said substrate layer substantially corresponding to that in said transfer layer.

3. The method of claim 2 wherein said substrate layer comprises silicon nitride.

4. The method of claim 2 wherein said substrate layer comprises an oxide of silicon.

5. The method of claim 2 wherein the step of providing a pattern in said transfer layer includes providing a photoresist material over said transfer layer, photolithographically producing a pattern of removed and retained regions in said photoresist layer and etching to remove the portions of said transfer layer exposed by said pattern in said layer of photoresist material.

* * * * *